United States Patent
Li

(10) Patent No.: US 10,705,668 B2
(45) Date of Patent: Jul. 7, 2020

(54) TOUCH PANEL, METHOD FOR FABRICATING THE SAME, AND TOUCH DEVICE

(71) Applicant: BOE Technology Group Co., Ltd., Beijing (CN)

(72) Inventor: Wang Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 58 days.

(21) Appl. No.: 16/103,234

(22) Filed: Aug. 14, 2018

(65) Prior Publication Data

US 2019/0265820 A1    Aug. 29, 2019

(30) Foreign Application Priority Data

Feb. 28, 2018 (CN) .......................... 2018 1 0167266

(51) Int. Cl.

| | |
|---|---|
| *G06F 3/041* | (2006.01) |
| *G06F 3/047* | (2006.01) |
| *H01L 23/14* | (2006.01) |
| *H01L 23/00* | (2006.01) |
| *H01L 29/40* | (2006.01) |
| *G06F 3/044* | (2006.01) |

(52) U.S. Cl.
CPC ............ *G06F 3/047* (2013.01); *G06F 3/0443* (2019.05); *G06F 3/0445* (2019.05); *G06F 3/0446* (2019.05); *G06F 3/04164* (2019.05); *H01L 23/147* (2013.01); *H01L 24/42* (2013.01); *H01L 29/40* (2013.01); *G06F 2203/04103* (2013.01); *G06F 2203/04111* (2013.01); *G06F 2203/04112* (2013.01)

(58) Field of Classification Search
None
See application file for complete search history.

(56) References Cited

U.S. PATENT DOCUMENTS

2016/0195983 A1* 7/2016 Miyake ................... G06F 3/044
                                                                                345/174

* cited by examiner

*Primary Examiner* — Carl Adams
(74) *Attorney, Agent, or Firm* — Arent Fox LLP; Michael Fainberg

(57) ABSTRACT

Disclosed are a touch panel, a method for fabricating the same, and a touch device. The touch panel includes a display area and a non-display area; the display area includes first touch-electrodes extending in a first direction, and second touch-electrodes extending in a second direction, insulated from each other and arranged intersecting with each other on a substrate, first signal-lines connected with the first touch-electrodes, and second signal-lines connected with second touch-electrodes; the non-display area includes a driver circuit arranged at one end of extension direction of second touch-electrodes, and connected with first signal-lines and second signal-lines; each first touch-electrode includes first grid-shaped electrode bumps connected in sequence in the first direction; and there are overlapping areas between orthographic-projections of first signal-lines, and orthographic-projections of first touch-electrodes onto the substrate, and orthographic-projections of first signal-lines lie into orthographic-projections of first grid-shaped electrode bumps onto the substrate in the overlapping areas.

18 Claims, 9 Drawing Sheets

TOUCH PANEL, METHOD FOR FABRICATING THE SAME, AND TOUCH DEVICE

CROSS-REFERENCE TO RELATED APPLICATION

This application claims priority of Chinese Patent Application No. 201810167266.3, filed on Feb. 28, 2018, which is hereby incorporated by reference in its entirety.

FIELD

The present disclosure relates to the field of display technologies, and particularly to a touch panel, a method for fabricating the same, and a touch device.

BACKGROUND

The existing development trend of the industry of touch and displays is touch and displays with ultra-narrow bezels, and the design of a narrow bezel can provide a display screen with a larger display area to thereby bring better visually-pleasing aesthetic feeling to its user. Taking as an example an Active-Matrix Organic Light-Emitting Diode (AMOLED) display screen integrated with a touch function, the effect of a bezel thereof is determined by a Thin Film Encapsulated (TFE) bezel component, a Touch Screen Panel (TSP) bezel component, and a bezel component on an AMOLED display panel.

SUMMARY

An embodiment of the disclosure provides a touch panel including a display area and a non-display area, wherein the display area includes a plurality of first touch electrodes extending in a first direction, and a plurality of second touch electrodes extending in a second direction, the first touch electrodes and the second touch electrodes are insulated from each other and arranged intersecting with each other on a substrate, first signal lines connected with the first touch electrodes, and second signal lines connected with the second touch electrodes; the non-display area includes a driver circuit arranged at one end of the extension direction of the second touch electrodes, and connected with the first signal lines and the second signal lines; each first touch electrode includes a plurality of first grid-shaped electrode bumps connected in sequence in the first direction; and there are overlapping areas between orthographic projections of the first signal lines onto the substrate, and orthographic projections of the first touch electrodes onto the substrate, and the orthographic projections of the first signal lines onto the substrate lie into orthographic projections of the first grid-shaped electrode bumps onto the substrate in the overlapping areas.

Optionally, the orthographic projections of the first signal lines onto the substrate do not overlap with orthographic projections of the second touch electrodes onto the substrate.

Optionally, each of the second touch electrodes includes a plurality of second grid-shaped electrode bumps connected in sequence in the second direction.

Optionally, both the first grid-shaped electrode bumps and the second grid-shaped electrode bumps are diamond-shaped electrode bumps.

Optionally, the first grid-shaped electrode bumps are diamond-shaped electrode bumps, and each of the second grid-shaped electrode bumps is an electrode bump in a shape of a diamond with a pair of corners in the first direction being arc-rounded corners.

Optionally, at most two of the first signal lines are arranged between two adjacent second touch electrodes.

Optionally, the first signal lines are grid-shaped signal lines.

Optionally, a size of grids of the grid-shaped signal lines is same as a size of grids of the grid-shaped electrode bumps in the first touch electrodes.

Optionally, a width of a grid contour of the grid-shaped signal lines ranges from 3 to 5 micrometers.

Optionally, an insulation layer with through-holes is arranged between the first signal lines and the first touch electrodes, and the first signal lines are connected with the first touch electrodes through the through-holes.

Optionally, orthographic projections of the through-holes onto the substrate lie into the orthographic projections of the first grid-shaped electrode bumps onto the substrate, so that the first signal lines are connected with the first grid-shaped electrode bumps.

Optionally, the first signal lines are arranged on sides of the first touch electrodes away from a finger.

Optionally, the second touch electrodes are bridged and connected above the first touch electrodes through bridge leads, and insulated from the first touch electrodes by an insulation layer, in areas where the first touch electrodes overlap with the second touch electrodes.

Optionally, an insulation layer is arranged between the first signal lines and the first touch electrodes; and the insulation layer between the first touch electrodes and the second touch electrodes is arranged at a layer same as a layer on which the insulation layer between the first touch electrodes and the first signal lines is arranged, and the first signal lines are arranged at a layer same as a layer on which the bridge leads are arranged, in the areas where the first touch electrodes overlap with the second touch electrodes.

Optionally, both the first signal lines and the second signal lines extend in the second direction, and the second touch electrodes are connected with the driver chip through the second signal lines connected with their same terminals.

An embodiment of the disclosure provides a method for fabricating a touch panel, the method including following steps: forming a pattern of the plurality of first touch electrodes extending in the first direction, and a pattern of the plurality of second touch electrodes extending in the second direction, the first touch electrodes and the second touch electrodes are insulated from each other and arranged intersecting with each other on the substrate; forming a pattern of the second signal lines connected with and arranged at a layer same as a layer on which the second touch electrodes are arranged; forming a pattern of the first signal lines connected with the first touch electrodes; and forming the driver circuit connected with the pattern of the second signal lines at one end of the extension direction of the second touch electrodes;

wherein the first signal lines and the second signal lines are arranged in the display area of the touch panel, each of the first touch electrodes includes the plurality of first grid-shaped electrode bumps connected in sequence in the first direction, there are the overlapping areas between the orthographic projections of the first signal lines onto the substrate, and the orthographic projections of the first touch electrodes onto the substrate, and the orthographic projections of the first signal lines onto the substrate lie into the orthographic projections of the first grid-shaped electrode bumps onto the substrate in the overlapping areas.

Optionally, the steps includes:

forming the pattern of the second touch electrodes, and the pattern of the second signal lines connected with and arranged at a layer same as a layer on which the second touch electrodes are, on the substrate;

forming the driver circuit connected with the pattern of the second signal lines at one end of the extension direction of the second touch electrodes;

forming a first insulation layer between the first touch electrodes and second first touch electrodes in an area where the first touch electrodes overlap with the second touch electrodes;

forming the pattern of the first touch electrodes on the first insulation layer;

forming a second insulation layer above the pattern of the first touch electrodes, and to form through-holes on the second insulation layer; and forming the pattern of the first signal lines, wherein the pattern of the first signal lines is connected with the first touch electrodes through the through-holes.

Optionally, the second touch electrodes are bridged and connected above the first touch electrodes through bridge leads in areas where the first touch electrodes overlap with the second touch electrodes; and the steps of includes:

forming the pattern of the first touch electrodes, the pattern of the second touch electrodes other than the bridge leads, and the pattern of the second signal lines connected with and arranged at a layer same as a layer on which the second touch electrodes are arranged, on the substrate;

forming the driver circuit connected with the pattern of the second signal lines at one end of the extension direction of the second touch electrodes;

forming a third insulation layer; and forming the pattern of the first signal lines, and the pattern of the bridge leads arranged at a layer same as a layer on which the pattern of the first signal lines are arranged.

An embodiment of the disclosure provides a touch device including the touch panel according to the embodiment of the disclosure.

BRIEF DESCRIPTION OF THE DRAWINGS

In order to make the technical solutions in the embodiments of the disclosure more apparent, the drawings to be used in a description of the embodiments will be briefly introduced below, and apparently the drawings to be described below are merely illustrative of some embodiments of the disclosure, and those ordinarily skilled in the art can derive from these drawings other drawings without any inventive effort.

DETAILED DESCRIPTION OF THE EMBODIMENTS

Figure 1:
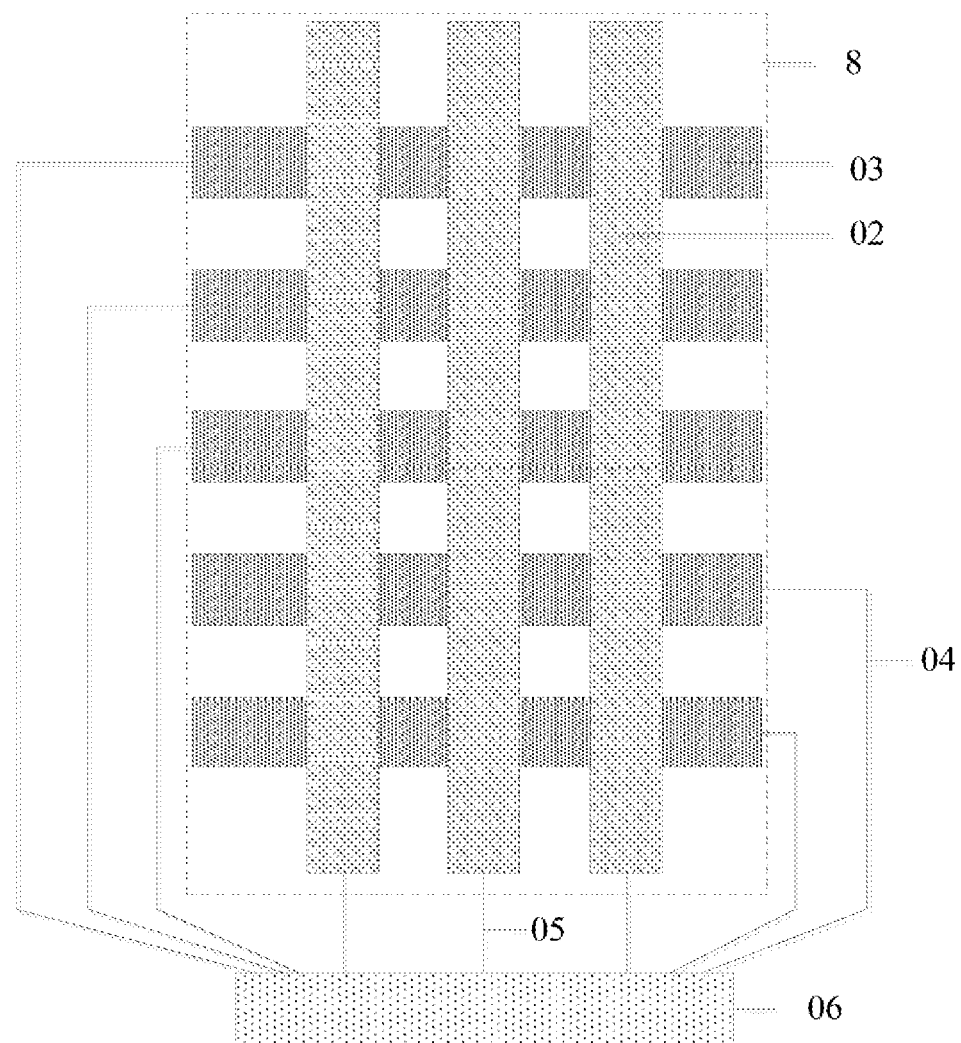
FIG. 1 is a schematic structural diagram of the TSP in the related art.

As illustrated in FIG. 1, the TSP includes touch sensing electrodes (TX) 02 and touch driver electrodes (RX) 03 arranged in a display area 8, RX signal traveling-lines 04, TX signal traveling-lines 05, and a TSP control chip 06, where the bezel component of the TSP generally includes the signal traveling-lines 04 which are arranged therein, and the smallest line width of a signal traveling-line, and a process for the spacing between the lines are restricting so that the width of the bezel area cannot be further reduced, thus making it difficult to reduce the total width of the signal lines. In summary the design of the narrow bezel of the display product has been limited by the design pattern of the touch electrodes and the signal traveling-lines in the TSP in the related art.

Figure 2:
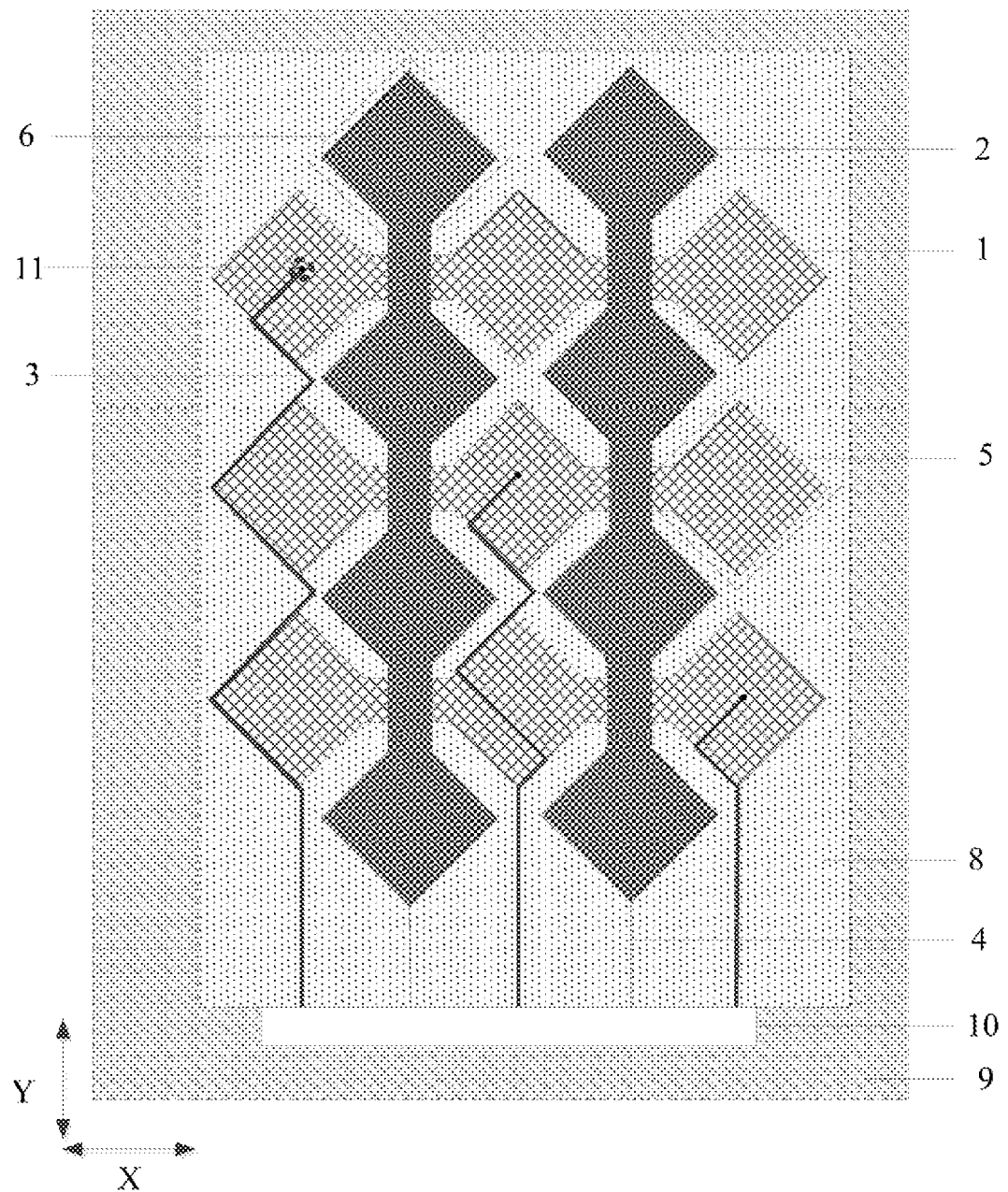
FIG. 2 is a schematic structural diagram of a touch panel according to an embodiment of the disclosure.

An embodiment of the disclosure provides a touch panel as illustrated in FIG. 2, which includes a display area 8 and a non-display area 9, where the display area 8 includes a plurality of first touch electrodes 1 extending in a first direction X, and a plurality of second touch electrodes 2 extending in a second direction Y, insulated from each other and arranged intersecting with each other on a substrate, first signal lines 3 connected with the first touch electrodes 1, and second signal lines 4 connected with the second touch electrodes 2; the non-display area 9 includes a driver circuit 10 arranged at one end of the extension direction of the second touch electrodes 2, and connected with the first signal lines 3 and the second signal lines 4; each first touch electrode 1 includes a plurality of first grid-shaped electrode bumps 5 connected in sequence in the first direction X; and there are overlapping areas between orthographic projections of the first signal lines 3 onto the substrate, and orthographic projections of the first touch electrodes 1 onto the substrate, and the orthographic projections of the first signal lines 3 onto the substrate lie into orthographic projections of the first grid-shaped electrode bumps 5 onto the substrate in the overlapping areas.

The touch panel according to the embodiment of the disclosure can be a mutually-capacitive multi-point touch panel applicable to a display product integrated with a touch function. In the touch panel according to the embodiment of the disclosure, the first touch electrodes each include a plurality of grid-shaped electrode bumps, and light emitted by pixels can exit the grids of the grid-shaped electrode bumps, so that the light emitted by the pixels can be avoided from being blocked by the touch electrodes, to thereby improve the efficiency of the exiting light; and since the first signal lines are arranged in the display area of the touch panel, no leads connected with the first touch electrodes will not be further arranged in another bezel area than the driver circuit in the non-display area, so that the size of the other bezel area than the driver circuit in the non-display area can be reduced to thereby provide a narrow bezel. Furthermore the orthographic projections of the first signal lines onto the substrate lie into the orthographic projections of the first grid-shaped electrode bumps onto the substrate in the overlapping areas, so that pixel openings of the touch panel can be further avoided from being blocked by the first signal lines, to thereby improve the visibility of routing and patterns in the display area of the touch panel so as to improve the experience of a user.

Figure 3:
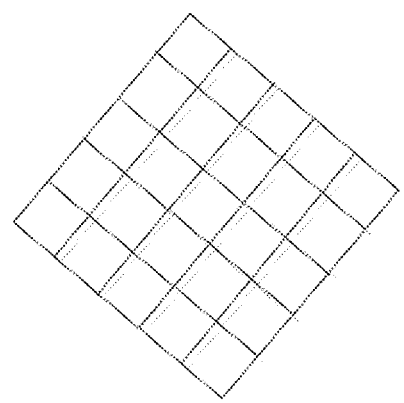
FIG. 3 is a schematic diagram of a grid-shaped electrode bump according to an embodiment of the disclosure.
Figure 4:
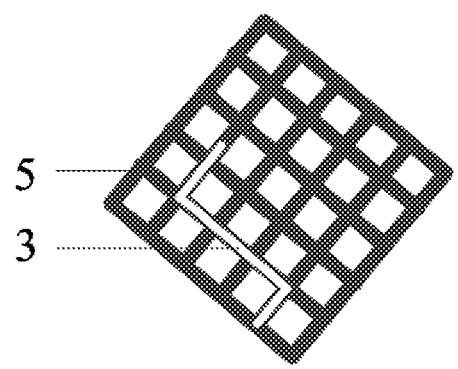
FIG. 4 is a schematic diagram of orthographic projections of first signal lines onto a substrate, which lie into orthographic projections of first grid-shaped electrode bumps according to an embodiment of the disclosure.

It shall be noted that the first touch electrodes 1 and the second touch electrodes 2 have been distinguished from each other using only two filling patterns in the structural diagram of the touch panel according to the embodiment of the disclosure (as illustrated in FIG. 2), and although the filling pattern of the second touch electrodes 2 is not a grid, actually both the first grid-shaped electrode bumps 5 and the second grid-shaped electrode bumps 6 may be grid-shaped electrode bumps as illustrated in FIG. 3. Furthermore, the first signal lines 3 have been represented in thick lines in the drawings only for the purpose of illustrating the arrangement pattern of the first signal lines 3 more apparently, but in fact, as illustrated in FIG. 4, the orthographic projections of the first signal lines 3 onto the substrate shall lie into the orthographic projections of the first grid-shaped electrode bumps 5 onto the substrate in the overlapping areas. The first direction is perpendicular to the second direction by way of an example in the structural diagram of the touch panel according to the embodiment of the disclosure, but of course, the first direction and the second direction can alternatively be other orthogonal directions.

Optionally, in the touch and display panel according to the embodiment of the disclosure as illustrated in FIG. 2, the orthographic projections of the first signal lines 3 onto the substrate do not overlap with orthographic projections of the second touch electrodes 2 onto the substrate, so that signals of the second touch electrodes can be avoided from interference in those areas of the second touch electrodes which are covered with the first signal lines.

Optionally, in the touch and display panel according to the embodiment of the disclosure as illustrated in FIG. 2, each second touch electrode 2 includes a plurality of second grid-shaped electrode bumps 6 connected in sequence in the second direction Y, so that both the first touch electrodes and the second touch electrodes include a plurality of grid-shaped electrode bumps to thereby further lower power consumption of the touch panel, and improve the sensitivity of the touch panel to a touch. Moreover the light emitted by the pixels can exit the grids in the grid-shaped electrode bumps to thereby avoid the light emitted by the pixels from being blocked by the touch electrodes, so as to improve the efficiency of the exiting light.

Figure 5:
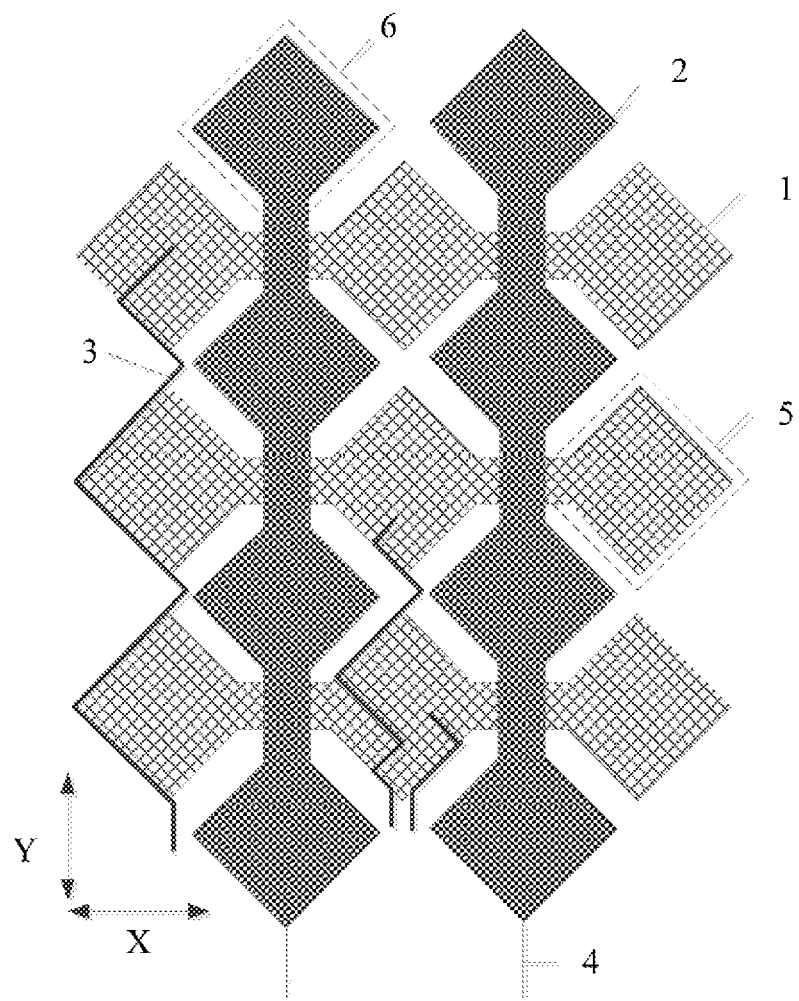
FIG. 5 is a schematic structural diagram of another touch panel according to an embodiment of the disclosure.

It shall be noted that in the touch panel according to the embodiment of the disclosure, the first touch electrodes can be RX, and the second touch electrodes can be TX; and typically the number of RX is greater than the number of TX, so the number of signal lines connected with the RX electrodes is greater than the number of signal lines connected with the TX electrodes, and thus such a case may occur that more than one first signal line is arranged between two adjacent columns of TX. However, there is a limited space of routing between the second touch electrodes, and in order to guarantee a sufficient distance between adjacent first signal lines to avoid signal interference, without overlapping with the second touch electrodes, optionally as illustrated in FIG. 5, at most two of the first signal lines are arranged between two adjacent second touch electrodes in the display area of the touch panel. Since each electrode corresponds to one of the signal lines, the number of RX electrodes is not greater than twice the number of TX electrodes.

Figure 6:
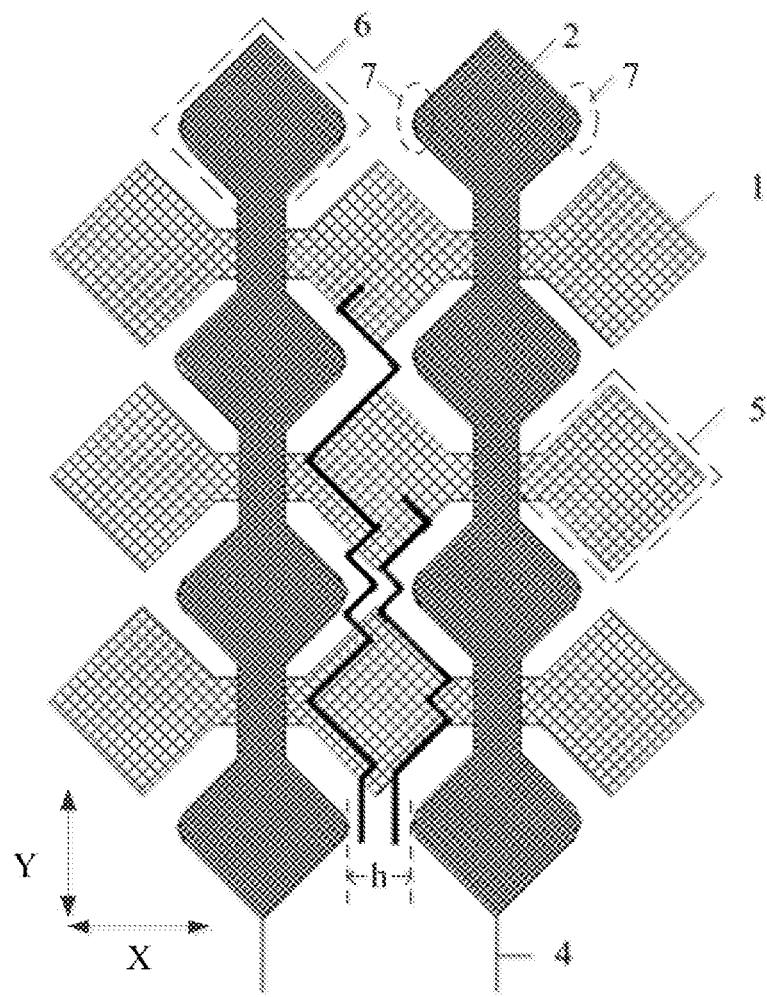
FIG. 6 is a schematic structural diagram of a further touch panel according to an embodiment of the disclosure.

In the touch panels as illustrated in FIG. 2 and FIG. 5, both the first grid-shaped electrode bumps and the second grid-shaped electrode bumps are diamond-shaped electrode bumps, and since the first touch electrodes and the second touch electrodes are arranged intersecting with each other, when the first grid-shaped electrode bumps are diamond-shaped electrode bumps, the second grid-shaped electrode bumps which are diamond-shaped electrode bumps can be exactly filled into areas surrounded by four adjacent first grid-shaped electrode bumps as many as possible to thereby maximize the area of the touch electrodes in the display area, and improve the utilization ratio of the space in the display area, and also the sensitivity of the touch panel to a touch. Of course, the first grid-shaped electrode bumps and the second grid-shaped electrode bumps can alternatively be electrode bumps in other shapes. For example, a pair of corners of each of the second grid-shaped electrode bumps in FIG. 2 and FIG. 5 in the first direction is arc-rounded corners. As illustrated in FIG. 6, in the display area of the touch panel according to the embodiment of the disclosure, the first grid-shaped electrode bumps 5 are diamond-shaped electrode bumps, and each of the second grid-shaped electrode bumps 6 is an electrode bump in the shape of a diamond with a pair of corners in the first direction being arc-rounded corners 7, so that the smallest spacing h between two adjacent second touch electrodes is larger than that between the second grid-shaped electrode bumps which are diamond-shaped to thereby provide a sufficient space for arranging the first signal lines so that a plurality of first signal lines can be arranged between two columns of second touch electrodes as needed.

It shall be noted that the shape of the first signal line can be set according to the shape of the first electrode bump, and the arrangement pattern of the grids. Optionally, the first signal lines are zigzag lines when the arrangement pattern of the grids of the first grid-shaped electrode bumps is one of the arrangement patterns of the grid-shaped electrode bumps in the touch panels as illustrated in FIG. 2, FIG. 5, and FIG. 6 according to the embodiments of the disclosure.

Figure 7:
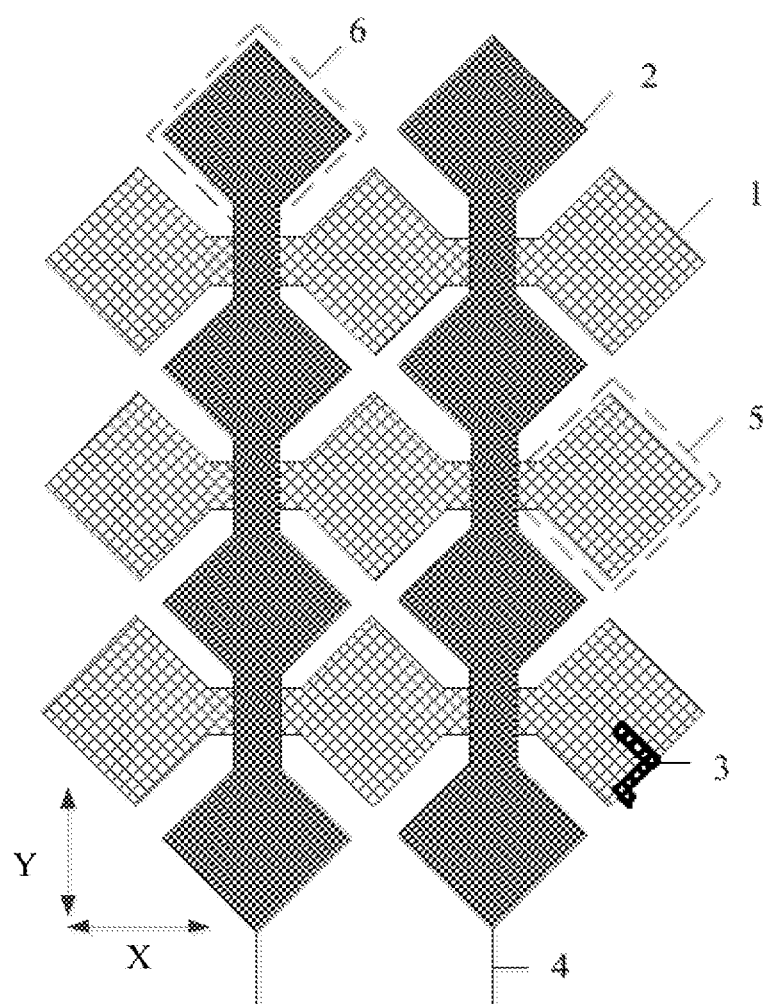
FIG. 7 is a schematic structural diagram of a further touch panel according to an embodiment of the disclosure.

In the touch panels according to the embodiments of the disclosure as illustrated in FIG. 2, FIG. 5, and FIG. 6, each first signal line is a single lead. Optionally, in the touch panels according to the embodiments of the disclosure, the first signal line can alternatively be a grid-shaped signal line, so that the resistance of the first signal line can be reduced to thereby lower power consumption of the touch panel. Taking as an example both the first grid-shaped electrode bumps and the second grid-shaped electrode bumps being are diamond-shaped electrode bumps, the arrangement pattern of the grid-shaped signal lines in the touch and display of the touch panel is as illustrated in FIG. 7.

Optionally, when the first signal lines are grid-shaped signal lines, the size of the grids of the grid-shaped signal lines is the same as the size of the grids of the grid-shaped electrode bumps in the first touch electrodes, so that the orthographic projections of the first signal lines onto the substrate can lie into the orthographic projections of the first grid-shaped electrode bumps onto the substrate in the overlapping areas without additionally designing the size of the grids of the grid-shaped signal lines, to thereby lower the complexity of the design of the touch panel.

Figure 8:
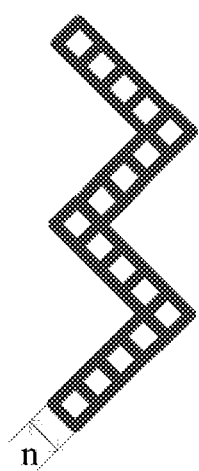
FIG. 8 is a schematic structural diagram of a grid-shaped electrode line according to an embodiment of the disclosure.

It shall be noted that if the grid-shaped signal lines are too thin, then the resistance of the signal lines may be so high that it is difficult for the driver circuit to drive the touch electrodes through the signal lines. If the grid-shaped signal lines are too thick, then the size of the grid-shaped electrode bumps will be increased accordingly, thus making the pattern of the grids visible, which would discourage the experience of a user. In order to avoid the grid-shaped signal lines from being too thick or thin, optionally when the first signal lines are grid-shaped signal lines, the width n of a grid contour of the grid-shaped signal lines ranges from 3 to 5 micrometers as illustrated in FIG. 8.

Optionally, an insulation layer with through-holes is arranged between the first signal lines and the first touch electrodes, and the first signal lines are connected with the first touch electrodes through the through-holes, so that the first signal lines will not be arranged at the same layer as the first touch electrodes, so the first signal lines will not occupy a limited touch pattern area in the display area of the touch panel, thus guaranteeing the precision of a touch in the display area of the touch panel, and avoiding a blind area of a touch.

Optionally, orthographic projections of the through-holes onto the substrate lie into the orthographic projections of the first grid-shaped electrode bumps onto the substrate, so that the first signal lines are connected with the first grid-shaped electrode bumps. Taking as an example the touch panel according to the embodiment of the disclosure as illustrated in FIG. 2, the area 11 is an area where the orthographic projection of a through-hole lies.

Optionally, the first signal lines can be arranged on the sides of the first touch electrodes away from a touch by a finger.

In this way, the first signal lines can be avoided from hindering the second touch electrodes from sensing a touch by a finger, while a touch is being detected.

Figure 9:
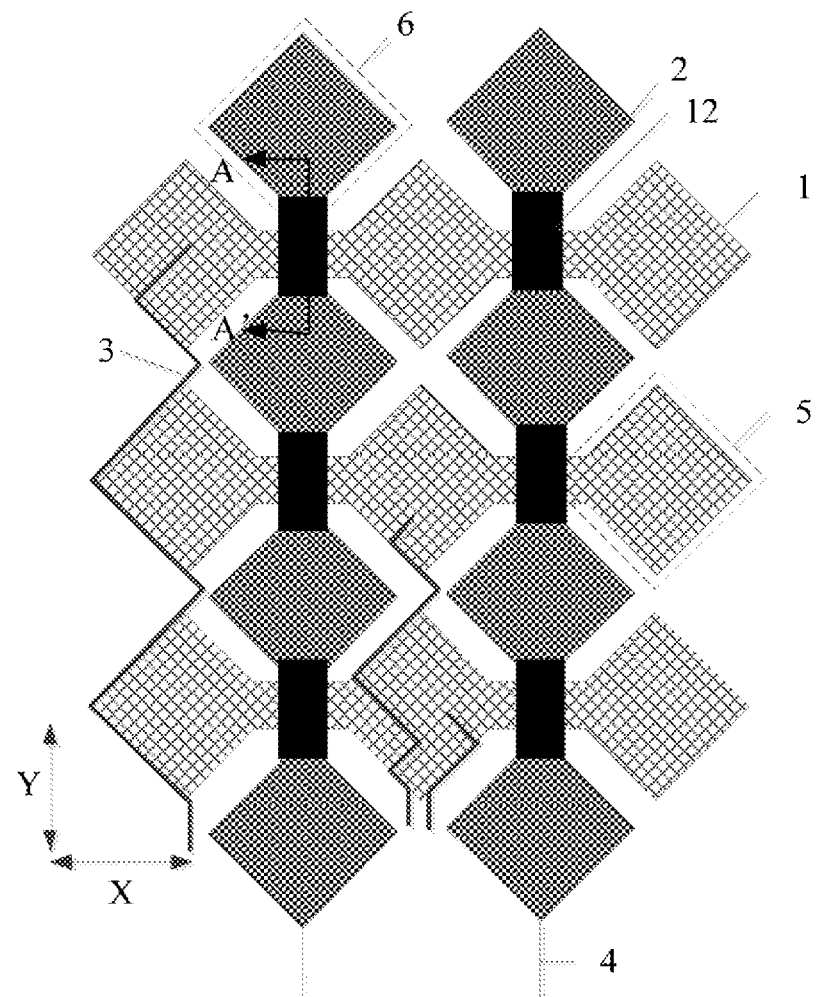
FIG. 9 is a schematic structural diagram of a further touch panel according to an embodiment of the disclosure.
Figure 10:
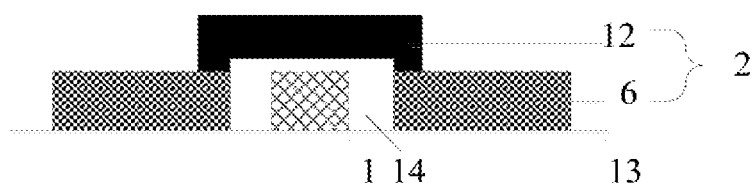
FIG. 10 is a schematic structural diagram of the touch panel as illustrated in FIG. 9 in a section along AA' according to an embodiment of the disclosure.

Optionally, the second touch electrodes are bridged and connected above the first touch electrodes through bridge leads, and insulated from the first touch electrodes by an insulation layer arranged in bridge areas, in areas where the first touch electrodes overlap with the second touch electrodes. Taking as an example the second touch electrodes each including a plurality of diamond-shaped grid-shaped electrode bumps, in the touch panel according to the embodiment of the disclosure as illustrated in FIG. 9, the second touch electrodes further include a bridge lead 12, and the second touch electrodes are bridged and connected above the first touch electrodes, that is, orthographic projections of the bridge leads 12 onto the substrate overly the orthographic projections of the first touch electrodes 1 onto the substrate in the bridge areas. FIG. 10 illustrates a schematic diagram of a section along AA' in FIG. 9, where the first touch electrodes 1 and the second touch electrodes 2 are arranged on the substrate 13, and the bridge leads 12 are connected with the second grid-shaped electrode bumps 6 in the areas where the first touch electrodes overlap with the second touch electrodes, and above the first touch electrodes 1, to form the second touch electrodes, and the first touch electrodes 1 are insulated from the second grid-shaped electrode bumps 6 and the bridge leads 12 by the insulation layer 14 arranged in the bridge areas.

Furthermore, when an insulation layer is arranged between the first signal lines and the first touch electrodes, the insulation layer between the first touch electrodes and the second touch electrodes is arranged at the same layer as the insulation layer between the first touch electrodes and the first signal lines, and the first signal lines are arranged at the same layer as the bridge leads of the second touch electrodes, in the areas where the first touch electrodes overlap with the second touch electrodes, so that those components of the second touch electrodes other than the bridge areas can be arranged at the same layer as the first touch electrodes, and since the first signal lines are arranged at the same layer as those components of the second touch electrodes which are bridged and connected, and the insulation layer between the first touch electrodes and the second touch electrodes is arranged at the same layer as the insulation layer between the first touch electrodes and the first signal lines, an additional layer of second touch electrodes will not be arranged, and an insulation layer may be dispensed with, thus simplifying the structure of the touch panel, and reducing the thickness of the touch panel.

Optionally, in the touch panel according to the embodiment of the disclosure as illustrated in FIG. 2, both the first signal lines 3 and the second signal lines 4 are arranged in the first direction X, and the second touch electrodes 2 are connected with the driver chip through the second signal lines 4 connected with their same terminals, so that in the case that both the first signal lines and the second signal lines are arranged in the display area, a process of fabricating the touch panel according to the embodiment of the disclosure can be made simple, and easy to perform.

Optionally, in the touch panels above according to the embodiments of the disclosure, the materials of the first touch electrodes, the second touch electrodes, the first signal lines, and the second signal lines can be molybdenum, for example, because it is easy to make the grid-shaped electrode bumps and the grid-shaped signal lines of the metal molybdenum. Of course, another metal of which the grid-shaped electrode bumps and the grid-shaped signal lines can be easily made may be selected as a material of the touch electrodes and the signal lines.

Based upon the same inventive idea, an embodiment of the disclosure further provides a method for fabricating a touch panel, where the method includes: forming a pattern of a plurality of first touch electrodes extending in a first direction, and a pattern of a plurality of second touch electrodes extending in a second direction, insulated from each other and arranged intersecting with each other on a substrate; forming a pattern of second signal lines connected with and arranged at the same layer as the second touch electrodes; forming a pattern of first signal lines connected with the first touch electrodes; and forming a driver circuit connected with the pattern of the second signal lines at one end of the extension direction of the second touch electrodes.

Where the first signal lines and the second signal lines are arranged in a display area of the touch panel, each of the first touch electrodes includes a plurality of first grid-shaped electrode bumps connected in sequence in the first direction, there are overlapping areas between orthographic projections of the first signal lines onto the substrate, and orthographic projections of the first touch electrodes onto the substrate, and the orthographic projections of the first signal lines onto the substrate lie into orthographic projections of the first grid-shaped electrode bumps onto the substrate in the overlapping areas.

Figure 11:
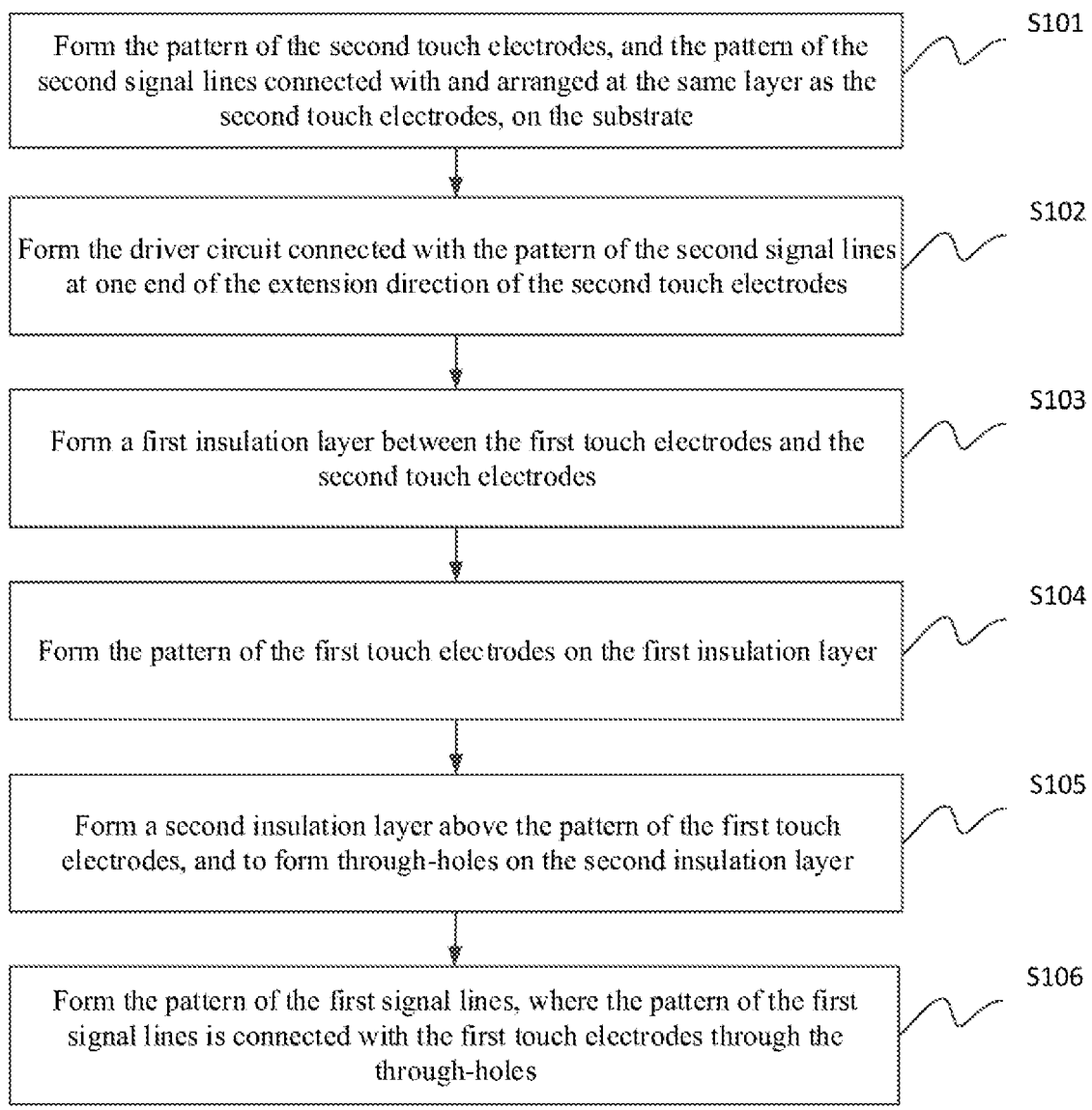
FIG. 11 is a flow chart of a method for fabricating a touch panel according to an embodiment of the disclosure.

Optionally, as illustrated in FIG. 11, the method for fabricating a touch panel according to an embodiment of the disclosure particularly includes the following steps.

S101 is to form the pattern of the second touch electrodes, and the pattern of the second signal lines connected with and arranged at the same layer as the second touch electrodes, on the substrate.

S102 is to form the driver circuit connected with the pattern of the second signal lines at one end of the extension direction of the second touch electrodes.

S103 is to form a first insulation layer between the first touch electrodes and the second touch electrodes in the areas where the first touch electrodes overlap with the second touch electrodes.

S104 is to form the pattern of the first touch electrodes on the first insulation layer.

S105 is to form a second insulation layer above the pattern of the first touch electrodes, and to form through-holes on the second insulation layer.

S106 is to form the pattern of the first signal lines, where the pattern of the first signal lines is connected with the first touch electrodes through the through-holes.

Figure 12:
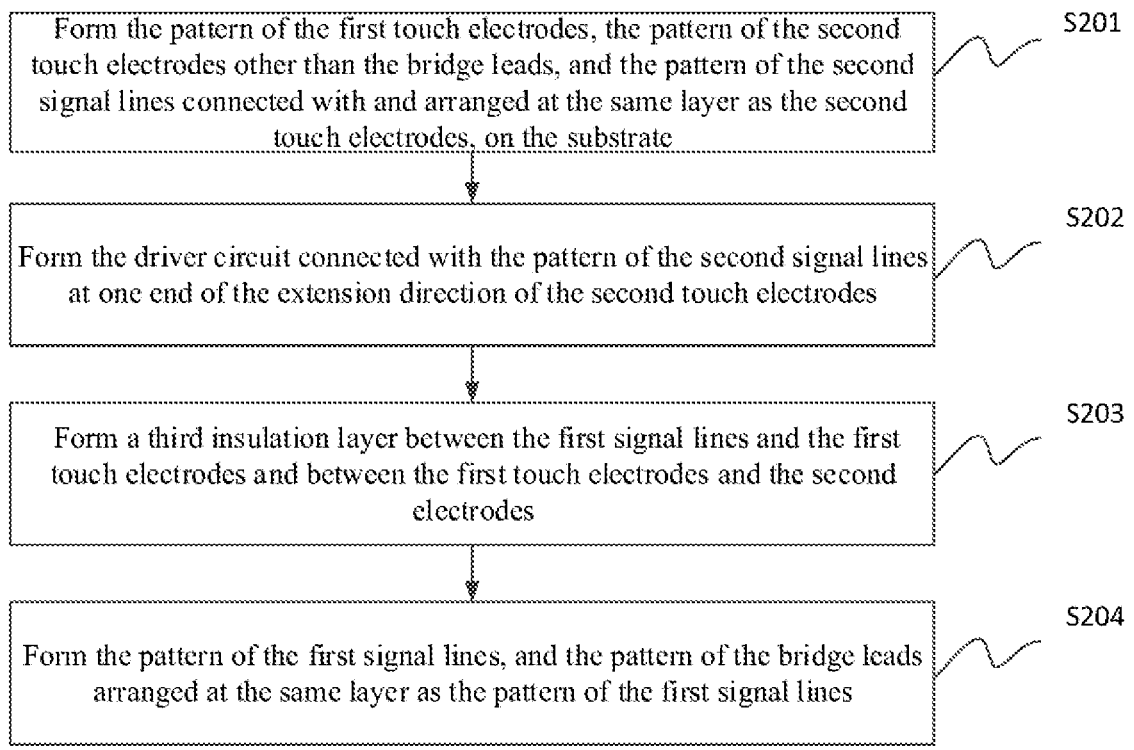
FIG. 12 is a flow chart of another method for fabricating a touch panel according to an embodiment of the disclosure.

In the method for fabricating a touch panel as illustrated in FIG. 11, the first touch electrodes and the second touch electrodes are located at different layers. Of course, components of the first touch electrodes and the second touch electrodes may alternatively be arranged at the same layer, and for example, the second the first touch electrodes and the second touch electrodes may be bridged and connected above the first touch electrodes and the second touch electrodes through bridge leads in areas where the first touch electrodes overlap with the second touch electrodes. Optionally, as illustrated in FIG. 12, when the second touch electrodes are bridged and connected above the first touch electrodes, the method for fabricating a touch panel according to the embodiment of the disclosure includes following steps.

S201 is to form the pattern of the first touch electrodes, the pattern of the second touch electrodes other than the bridge leads, and the pattern of the second signal lines connected with and arranged at the same layer as the second touch electrodes, on the substrate.

S202 is to form the driver circuit connected with the pattern of the second signal lines at one end of the extension direction of the second touch electrodes.

S203 is to form a third insulation layer between the first signal lines and the first touch electrodes and between the first touch electrodes and the second touch electrodes.

S204 is to form the pattern of the first signal lines, and the pattern of the bridge leads arranged at the same layer as the pattern of the first signal lines.

In the method for fabricating a touch panel according to the embodiment of the disclosure as illustrated in FIG. 12, those components of the second touch electrodes in other than the bridge areas are arranged at the same layer as the first touch electrodes, and since the first signal lines are arranged at the same layer as those components of the second touch electrodes which are bridged and connected, and the insulation layer between the first touch electrodes and the second touch electrodes is arranged at the same layer as the insulation layer between the first touch electrodes and the first signal lines, an additional layer of second touch electrodes will not be arranged, and an insulation layer may be dispensed with, thus simplifying the structure of the touch panel, and reducing the thickness of the touch panel.

Based upon the same inventive idea, an embodiment of the disclosure further provides a touch device including the touch panel according to any one of the embodiments above of the disclosure.

The touch device according to the embodiment of the disclosure can be a mobile phone, a tablet, a TV set, or another device.

In summary, in the touch panel, the method for fabricating the same, and the touch device according to the embodiments of the disclosure, the first touch electrodes each include a plurality of grid-shaped electrode bumps, and the grid-shaped electrode bumps can be applicable to a touch and display product to thereby lower power consumption of the touch panel, and improve the sensitivity of the touch panel to a touch, and the efficiency of light exiting the pixels; since the first signal lines are arranged in the display area of the touch panel, no leads connected with the first touch electrodes will be further arranged in another bezel area than the driver circuit in the display area, so that the size of the other bezel area than the driver circuit in the non-display area can be reduced to thereby provide a narrow bezel; and since the orthographic projections of the first signal lines lie into the orthographic projections of the first grid-shaped electrode bumps in the overlapping areas, pixel openings of the touch panel can be further avoided from being blocked by the first signal lines, to thereby improve the visibility of routing and patterns in the display area of the touch panel so as to improve the experience of a user.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A touch panel, comprising a display area and a non-display area, wherein the display area comprises:
   a plurality of first touch electrodes extending in a first direction, and a plurality of second touch electrodes extending in a second direction, the first touch electrodes and the second touch electrodes are insulated from each other and arranged intersecting with each other on a substrate;
   first signal lines connected with the first touch electrodes, and second signal lines connected with the second touch electrodes;
   the non-display area comprises a driver circuit arranged at one end of an extension direction of the second touch electrodes, and connected with the first signal lines and the second signal lines;
   each first touch electrode comprises a plurality of first grid-shaped electrode bumps connected in sequence in the first direction; and there are overlapping areas between orthographic projections of the first signal lines onto the substrate and orthographic projections of the first touch electrodes onto the substrate, and the orthographic projections of the first signal lines onto the substrate lie into orthographic projections of the first grid-shaped electrode bumps onto the substrate in the overlapping areas;
   wherein the orthographic projections of the first signal lines onto the substrate do not overlap with orthographic projections of the second touch electrodes onto the substrate.

2. The touch panel according to claim 1, wherein each of the second touch electrodes comprises a plurality of second grid-shaped electrode bumps connected in sequence in the second direction.

3. The touch panel according to claim 2, wherein both the first grid-shaped electrode bumps and the second grid-shaped electrode bumps are diamond-shaped electrode bumps.

4. The touch panel according to claim 2, wherein the first grid-shaped electrode bumps are diamond-shaped electrode bumps, and each of the second grid-shaped electrode bumps is an electrode bump in a shape of a diamond with a pair of corners in the first direction being arc-rounded corners.

5. The touch panel according to claim 1, wherein at most two of the first signal lines are arranged between two adjacent second touch electrodes.

6. The touch panel according to claim 1, wherein the first signal lines are grid-shaped signal lines.

7. The touch panel according to claim 6, wherein a size of grids of the grid-shaped signal lines is same as a size of grids of the grid-shaped electrode bumps in the first touch electrodes.

8. The touch panel according to claim 6, wherein a width of a grid contour of the grid-shaped signal lines ranges from 3 to 5 micrometers.

9. The touch panel according to claim 1, wherein an insulation layer with through-holes is arranged between the first signal lines and the first touch electrodes, and the first signal lines are connected with the first touch electrodes through the through-holes.

10. The touch panel according to claim 9, wherein orthographic projections of the through-holes onto the substrate lie into the orthographic projections of the first grid-shaped electrode bumps onto the substrate.

11. The touch panel according to claim 9, wherein the first signal lines are arranged on sides of the first touch electrodes away from a finger.

12. The touch panel according to claim 1, wherein the second touch electrodes are bridged and connected above the first touch electrodes through bridge leads, and insulated from the first touch electrodes by an insulation layer, in areas where the first touch electrodes overlap with the second touch electrodes.

13. The touch panel according to claim 12, wherein an insulation layer is arranged between the first signal lines and the first touch electrodes; and the insulation layer between the first touch electrodes and the second touch electrodes is arranged at a same layer as a layer on which the insulation layer between the first touch electrodes and the first signal lines is arranged, and the first signal lines are arranged at a same layer as a layer on which the bridge leads are arranged, in the areas where the first touch electrodes overlap with the second touch electrodes.

14. The touch panel according to claim 1, wherein both the first signal lines and the second signal lines extend in the second direction, and the second touch electrodes are connected with the driver chip through the second signal lines connected with a terminal of the second signal lines.

15. A method for fabricating the touch panel according to claim 1, comprising following steps:
    forming a pattern of the plurality of first touch electrodes extending in the first direction, and a pattern of the plurality of second touch electrodes extending in the second direction, the first touch electrodes and the second touch electrodes are insulated from each other and arranged intersecting with each other on the substrate;
    forming a pattern of the second signal lines connected with and arranged at a same layer as a layer on which the second touch electrodes are arranged;
    forming a pattern of the first signal lines connected with the first touch electrodes; and
    forming the driver circuit connected with the pattern of the second signal lines at one end of an extension direction of the second touch electrodes;
    wherein the first signal lines and the second signal lines are arranged in the display area of the touch panel, each of the first touch electrodes comprises the plurality of first grid-shaped electrode bumps connected in sequence in the first direction, there are the overlapping areas between the orthographic projections of the first signal lines onto the substrate, and the orthographic projections of the first touch electrodes onto the substrate, and the orthographic projections of the first signal lines onto the substrate lie into the orthographic projections of the first grid-shaped electrode bumps onto the substrate in the overlapping areas.

16. The method according to claim 15, wherein the steps comprise:
    forming the pattern of the second touch electrodes, and the pattern of the second signal lines connected with and arranged at a same layer as a layer on which the second touch electrodes are arranged, on the substrate;
    forming the driver circuit connected with the pattern of the second signal lines at one end of the extension direction of the second touch electrodes;
    forming a first insulation layer between the first touch electrodes and the second touch electrodes in an area where the first touch electrodes overlap with the second touch electrodes;
    forming the pattern of the first touch electrodes on the first insulation layer;
    forming a second insulation layer above the pattern of the first touch electrodes, and forming through-holes on the second insulation layer; and
    forming the pattern of the first signal lines, wherein the pattern of the first signal lines is connected with the first touch electrodes through the through-holes.

17. The method according to claim 15, wherein the second touch electrodes are bridged and connected above the first touch electrodes through bridge leads in areas where the first touch electrodes overlap with the second touch electrodes; and the steps comprise:
    forming the pattern of the first touch electrodes, the pattern of the second touch electrodes other than the bridge leads, and the pattern of the second signal lines connected with and arranged at a same layer as a layer on which the second touch electrodes are arranged, on the substrate;
    forming the driver circuit connected with the pattern of the second signal lines at one end of the extension direction of the second touch electrodes;
    forming a third insulation layer between the first signal lines and the first touch electrodes and between the first touch electrodes and the second touch electrodes; and
    forming the pattern of the first signal lines, and the pattern of the bridge leads arranged at a same layer as a layer on which the pattern of the first signal lines is arranged.

18. A touch device, comprising the touch panel according to claim 1.

* * * * *